(12) United States Patent
Kim

(10) Patent No.: US 7,315,349 B2
(45) Date of Patent: Jan. 1, 2008

(54) EXPOSURE EQUIPMENT WITH OPTICAL SYSTEM POSITIONING MECHANISM AND RELATED EXPOSURE METHOD

(75) Inventor: Jang-Sun Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 215 days.

(21) Appl. No.: 11/192,284

(22) Filed: Jul. 29, 2005

(65) Prior Publication Data

US 2006/0061742 A1 Mar. 23, 2006

(30) Foreign Application Priority Data

Sep. 21, 2004 (KR) ............. 10-2004-0075669

(51) Int. Cl.
*G03B 27/42* (2006.01)
*G03B 27/58* (2006.01)
*G03B 27/62* (2006.01)
*G03B 27/32* (2006.01)

(52) U.S. Cl. .................. 355/53; 355/72; 355/75; 355/77

(58) Field of Classification Search ............ 355/53, 355/72, 75, 77
See application file for complete search history.

(56) References Cited

U.S. PATENT DOCUMENTS 6,144,118 A * 11/2000 Cahill et al. ........... 310/12
6,816,232 B2 * 11/2004 Takahashi et al. ......... 355/53
6,879,375 B1 * 4/2005 Kayama ................. 355/53
6,897,939 B2 * 5/2005 Hara ..................... 355/53
2003/0053035 A1 * 3/2003 Butler et al. ............. 355/53
2005/0140955 A1 * 6/2005 Butler et al. ............. 355/69

FOREIGN PATENT DOCUMENTS

| JP | 10261580 | 9/1998 |
| JP | 11325821 | 11/1999 |
| JP | 2001-015409 | 1/2001 |
| KR | 1994-0016440 | 7/1994 |
| KR | 1998080359 | 11/1998 |
| KR | 1020040024898 A | 3/2004 |

OTHER PUBLICATIONS

English translation of JP 2001-15409 (dated Jan. 19, 2001) cited by Applicant in his IDS.*

* cited by examiner

*Primary Examiner*—Alan Mathews
(74) *Attorney, Agent, or Firm*—Volentine & Whitt, PLLC

(57) ABSTRACT

Exposure equipment useful in the manufacture of semiconductor devices and a related method of operation are disclosed. The exposure equipment directs light through a reticle and an optical system positioned above a wafer onto a target portion of the wafer, and the wafer is rapidly transferred under the directed light to irradiate substantially the entire surface of the wafer. Recursive compensation for undesired movement of the reticle and optical system caused by the rapid transfer of the wafer is provided.

11 Claims, 3 Drawing Sheets

EXPOSURE EQUIPMENT WITH OPTICAL SYSTEM POSITIONING MECHANISM AND RELATED EXPOSURE METHOD

BACKGROUND OF INVENTION

1. Technical Field

The present invention relates to an exposure equipment adapted for use in the manufacture of semiconductor devices. More particularly, the invention relates to exposure equipment and related methods of operation in which an optical system is positioned so as to minimize imaging errors.

This application claims priority from Korean Patent Application No. 2004-75669 filed Sep. 21, 2004, the disclosure of which is hereby incorporated by reference in its entirety.

2. Discussion of the Related Art

The manufacture of semiconductor devices is a long and complicated process. It generally starts with the fabrication of defect-free silicon wafer. Before actually forming circuits and elements on the wafer it must be carefully machined, polished and cleaned. Thereafter, a multiplicity of specific processes are sequentially applied to the wafer in order to form the multi-layer circuits and elements that constitute a contemporary semiconductor device. Such processes are conventional in nature and well understood. They include, as ready examples, processes related to photolithography, etching, thin film deposition, diffusion, etc.

Photolithography is a well known process that comes in a variety of types and capabilities. Generally speaking, however, a photolithography process transfers geometric shapes defined by a mask onto the surface of the silicon wafer being processed. The steps typically involved in a photolithographic process include; wafer cleaning, barrier layer formation, photoresist application, soft baking, mask alignment, exposure and development, and hard baking.

The photolithography exposure is a process of transferring a circuit pattern formed on a reticle onto the surface of a wafer, wherein the wafer has a photosensitive film applied thereon. The circuit pattern is transferred through an optical system which optically reduces it during transfer. The photolithography exposure process is typically implemented using exposure equipment, such as a scanner.

Given the minute detail involved in most contemporary circuit patterns, it is very important to continuously inspect and, if necessary, correct the physical position of the exposure equipment in relation to the wafer. Highly accurate positioning of the exposure equipment is required in order for the circuit pattern formed on the reticle to be precisely transferred onto each targeted portion of the wafer. Each circuit pattern transfer is sometimes referred to as a "shot."

This delicate positioning process is further complicated by the speed at which contemporary semiconductor fabrication lines operate. In practical application, the exposure equipment moves very quickly between respective shot positions. Unfortunately, mechanical vibration is often an undesired byproduct of the rapid positioning of the exposure equipment. Unless corrected or compensated for, a transfer image defect referred to as a "dynamic performance error" may arise from this vibration. Accordingly, high-precision inspection and compensation operations are indispensably required.

Several conventional methods have been proposed to reduce the risk of dynamic performance error. For example, one conventional method of reducing dynamic performance error shields the optical system from vibration by maintaining a vacuum state within certain interior portions of the exposure equipment. Another conventional method of reducing dynamic performance error compensates for such errors at the reticle stage of the process. However, these conventional methods only partially eliminate the dynamic performance error, and the resulting transfer image defect is only partially remediated.

Residual transfer image defects pose an increasingly unacceptable risk to the accurate fabrication of semiconductor devices. For example, the width of a circuit line in contemporary semiconductor devices may be as small as only 110 nm. Conventional methods of reducing transfer image defects are not adequate in the context of such highly precise circuit dimensions and tolerances. Consequently, an improved photolithography method having a better transfer image defect remedy is required.

SUMMARY OF THE INVENTION

Recognizing the foregoing deficiencies in the conventional methods, embodiments of the present invention provide exposure equipment and related methods of operation that eliminate or minimize the error produced by undesired movement of a reticle and/or an optical system within the exposure equipment due to the rapid transfer of a wafer by the exposure equipment.

In one embodiment, exposure equipment is provided that comprises a wafer seat adapted to seat a wafer, an illuminating system adapted to irradiating the wafer with light of a desired wavelength, a reticle support interposed between the wafer seat and the illuminating system and adapted to hold a reticle such that the light from the illuminating system passes through the reticle to the wafer, an optical system interposed between the wafer seat and the reticle support and adapted to transmit the patterned light from the reticle to a target portion of the wafer, and optical-system positioning mechanism adapted to measure and compensate for movement of the optical system.

In related aspects, the wafer seat comprises a wafer transferring unit adapted to transfer the wafer, such that the light may irradiate substantially the entire surface of the wafer, and the reticle support comprises a reticle-position correcting unit adapted to compensate for a vibration induced positioning error produced by movement of the wafer seat.

In another related aspect, the optical-system positioning mechanism comprises a plurality of position sensors adapted to detect movement of the optical system, and a correction unit adapted to adjust the position of the optical system in accordance with data provided by the plurality of position sensors. The plurality of position sensors may comprise at least two geophone sensors mounted to an outer periphery of the optical system to detect movement in the X-axis direction and movement of the optical system in the Y-axis direction, respectively, and the correction unit may comprise at least two electric motors mounted to an outer periphery of the optical system to correct the position of the optical system in the X-axis direction and the Y-axis direction, respectively.

In yet another aspect, the optical-system positioning mechanism comprises a correction unit adapted to position of the optical system, a data comparator adapted to compare movement data from the wafer transferring unit and compensation data from the reticle-position correcting unit with a reference data in order to define a compensation value to be applied to the optical system, and a unit controller adapted to control the correction unit to allow the correction unit to adjust the position of the optical system in accordance with the compensation value from the data comparator.

In another embodiment, an exposure method characterized by a position compensation process useful in the manufacture of semiconductor devices is provided. The method comprises irradiating a target portion of a wafer with light having a desired wavelength, wherein the light is directed to the target portion of the wafer by an optical system positioned above the wafer, transferring the wafer, such that light irradiates substantially an entire surface of the wafer, and correcting the position of the optical system in accordance with detected movement of the optical system caused by transfer of the wafer.

In a related aspect, the light is directed to the target portion of the wafer through a reticle positioned above the wafer, and the method further comprises correcting the position of the reticle in response to movement data associated with transfer of the wafer.

The method may also comprise comparing movement data associated with transfer of the wafer and compensation data associated with the position of the reticle with a reference data in order to define a position compensation value for the optical system, wherein the step correcting the position of the optical system is performed in relation to the position compensation value.

The method may also comprises detecting the position of the optical system following the step of correcting the position of the optical system and generating positional data, and/or comparing the positional data with the reference data. Where this comparison is performed, upon determining that the positional data is identical to the reference data, the position compensation process is ended. However, upon determining that the positional data is not identical to the reference data the correction step may be repeated.

In yet another embodiment, a method of operating exposure equipment useful in the manufacture of semiconductor devices is provided. The method comprises directing light through a reticle and an optical system positioned above a wafer onto a target portion of the wafer, rapidly transferring the wafer under the directed light to irradiate substantially the entire surface of the wafer, and recursively compensating for undesired movement of the reticle and optical system caused by the rapid transfer of the wafer.

In one aspect, the recursive compensation comprises correcting the position of the reticle, correcting the position of the optical system in relation to reference data, detecting the corrected position of the optical system to define a positional value, and comparing the positional data to the reference data.

BRIEF DESCRIPTION OF THE DRAWINGS

The invention, along with several its associated advantages and benefits, will become more apparent upon consideration of one or more embodiments described below. In the drawings, like reference numbers refer to like or similar elements. In the attached drawings.

DETAILED DESCRIPTION OF THE INVENTION

Figure 1:
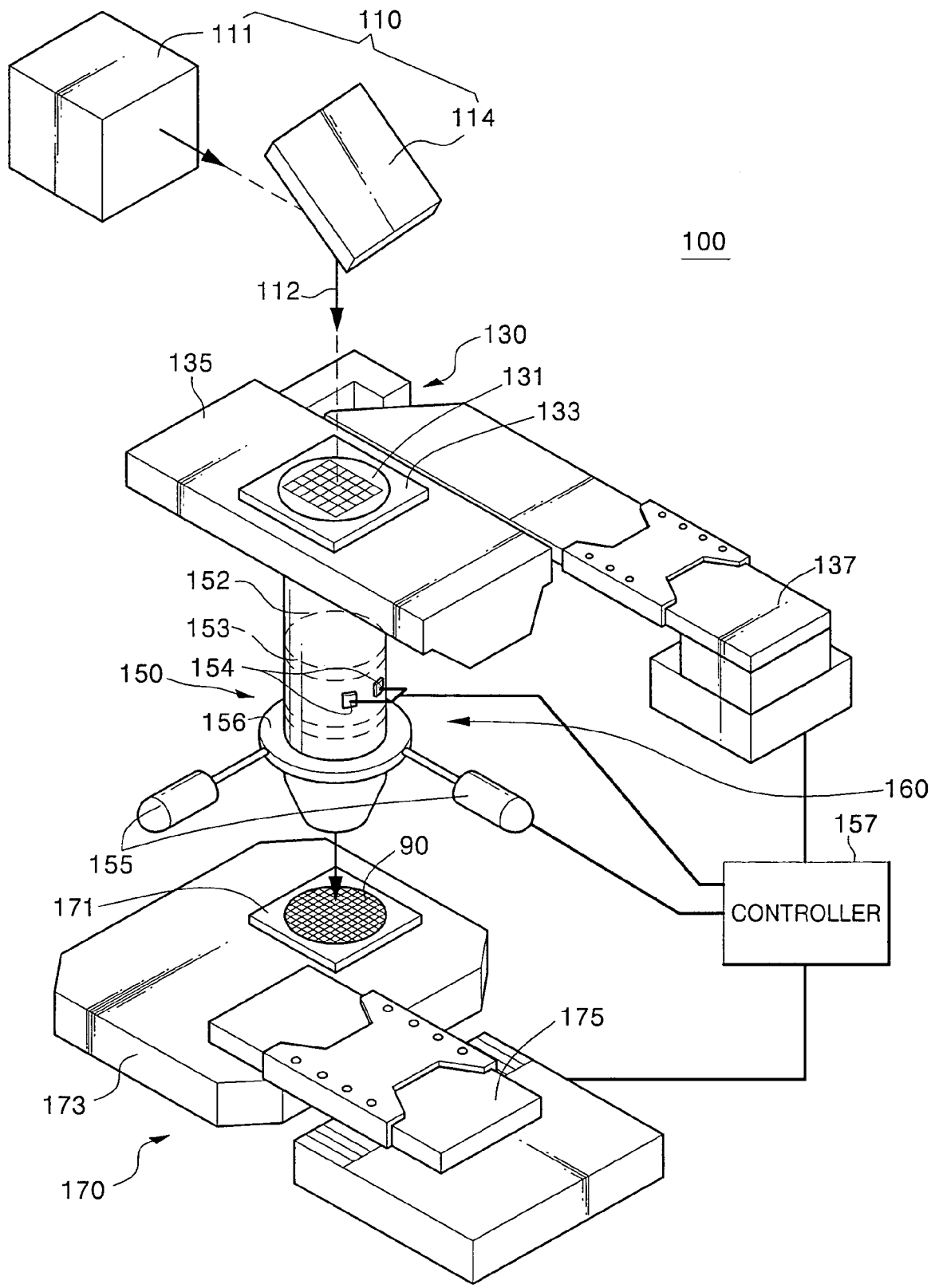
FIG. 1 is a perspective view depicting an exposure equipment according an embodiment of the present invention.

Embodiment(s) of the invention will now be described in some additional detail with reference to the accompanying drawings. Those of ordinary skill in the art will recognize that the invention may be embodied in many different forms and should not be construed as being limited to only the embodiment(s) set forth herein. Rather, the following embodiment(s) are presented as teaching example(s).

Figures (FIGS.) 1 and 2 show exposure equipment (collectively 100) according to one embodiment of the invention. Exposure equipment 100 comprises a wafer seat 170 having a wafer 90 seated thereon, an illuminating system 110 for irradiating light at a desired wavelength onto wafer 90, and a reticle support 130 interposed between wafer seat 170 and illuminating system 110.

Reticle support 130 includes a reticle 131 defining a pattern to be transferred to wafer 90. In operation, reticle 131 is irradiated by light emanating from illuminating system 110 such that patterned light strikes wafer 90.

Exposure equipment 100 further comprises an optical system 150 interposed between wafer seat 170 and reticle support 130. Optical system 150 transmits the patterned light output from reticle 131 onto a target portion of wafer 90 and includes in this embodiment an optical system positioning mechanism 160. Optical system positioning mechanism 160 is adapted to measure and, if necessary, compensate for movement of optical system 150 during exposure of wafer 90.

Exposure equipment 100 is typically responsive to a controller (not shown).

More specifically, wafer seat 170 includes a wafer stage 171 seating wafer 90, a wafer support 173 supporting wafer stage 171, and a wafer transferring unit 175 transferring wafer stage 171 in the X and/or Y direction over a certain distance in order to advance the photolithography process. Wafer transferring unit 175 may be, for example, an electric motor.

The light provided by illuminating system 110 irradiates onto only the target portion of wafer 90. As illuminating system 110 does this, wafer transferring unit 175 transfers wafer 90 in the X and/or Y direction over a certain distance, such that the light is ultimately irradiated onto the entire surface of wafer 90.

As shown in FIG. 1, illuminating system 110 irradiates wafer 90 from a position above the wafer. Illuminating system 110 includes a light source 111 adapted to output light at a desired wavelength, and a reflection unit 114 adapted to optically direct light received from light source 111 onto a target portion of wafer 90. Light source 111 may include, for example, a 248 nm wavelength KrF excimer laser, a 193 nm wavelength ArF excimer laser, or similar light source. Reflection unit 114 may utilize, for example, one or more mirror elements.

Reticle support 130 is interposed between wafer seat 170 and illuminating system 110 above wafer seat 170, such that the light irradiated onto wafer 90 from illuminating system 110 passes through reticle 131. Reticle support 130 includes in addition to reticle 131, a reticle stage 133 adapted to seat reticle 131, a reticle support portion 135 adapted to support reticle stage 133, and a reticle-position correcting unit 137 adapted to minutely move (i.e., adjust) reticle stage 133 in the Y direction, if necessary, during the photolithography process.

As noted above, wafer transferring unit 175 is adapted to transfer wafer 90 in either (or both) of the X and/or Y direction in order to accurately enable light irradiation over the entire surface of wafer 90. Reticle 131 and reticle support 130 which are seated on wafer transferring unit 175 will, in fact, minutely move due to mechanical vibrations associated with the transfer of wafer 90 by wafer transferring unit 175. Accordingly, reticle 131 may at times become minutely but undesirably shifted from its original position (referred to as "set point"). Reticle position correcting unit 137 serves to partially compensate for such vibration induced positioning error.

Optical system 150 transmits the light patterned by reticle 131 onto a target portion of wafer 90. Optical system 150 further comprises a hollow cylindrical barrel 152, and a plurality of lenses 153 installed in barrel 152. Preferably, the plurality of lenses 153 includes a reducing projection lens adapted to reduce the size of the patterned light from reticle 131 to a desired size.

Optical system positioning mechanism 160 further comprises correction unit 155 adapted to re-position optical system 150 in accordance with a desired compensation value. Optical system positioning mechanism also comprises a plurality of position sensors 154 installed in an outer periphery of barrel 152 and adapted to detect the movement of optical system 150. This detected movement may then be compensated by the operative combination of correction unit 155, a control unit 157 connected to correction unit 155 and the plurality of position sensors 154. In other words, appropriate compensation values may be derived by controller 157 based on data received from the plurality of position sensors 154 and then applied to correction unit 155.

Correction unit 155 of optical system 150 may include a barrel clamp 156 installed around the outer periphery of barrel 152 and adapted to hold barrel 152, and an actuator (not shown) coupled to barrel clamp 156 and adapted to correct the position of optical system 150. Preferably, the actuator includes at least two motors individually adapted to correct in the X-axis direction and the Y-axis direction, respectively.

Preferably, the plurality of position sensors 154 is installed in such a manner as to detect the entire range of movement for optical system 150 including barrel 152. For example, the plurality of position sensors 154 may include at least two geophone sensors mounted on the outer periphery of barrel 152 to detect an movement in the X-axis direction for optical system 150 and movement in the Y-axis direction for optical system 150, respectively.

Control unit 157 includes a data comparator 158 connected to wafer transferring unit 175 and reticle-position correcting unit 137. Data comparator 158 is adapted to make comparisons related to movement or position data from wafer transferring unit 175 and reticle-position correcting unit 137 in relation to reference data received from optical system detecting system 154. The comparison results may be output to unit controller 159 as a position compensation value adapted to compensate for any undesired movement in the position of optical system 150.

For example, unit controller 159 may directly control correction unit 155 to allow this unit to correctly position optical system 150 according to the position compensation value provided by data comparator 158. Alternatively, data comparator 158 may detect compensation data applied to correction unit 155, as well as the movement data from wafer transferring unit 175 and compensation data from reticle-position correcting unit 137 in order to determine whether applied compensation data is identical to the reference data. Where the applied compensation data is not identical to the reference data, data comparator 158, again through a comparison function, may re-compensate for the errant position of optical system 150.

Figure 2:
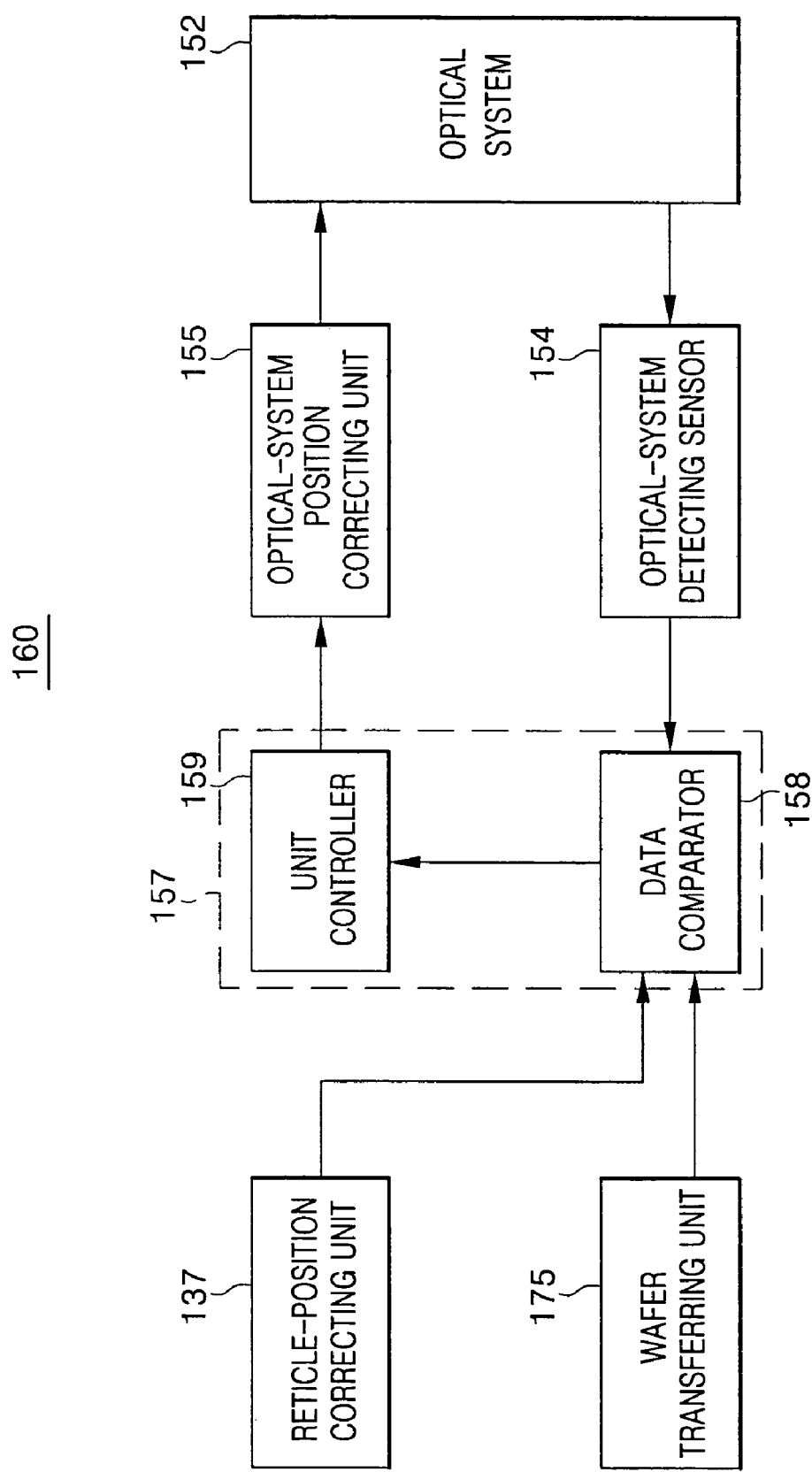
FIG. 2 is a schematic view depicting a means for positioning an optical system according to an embodiment of the present invention.
Figure 3:
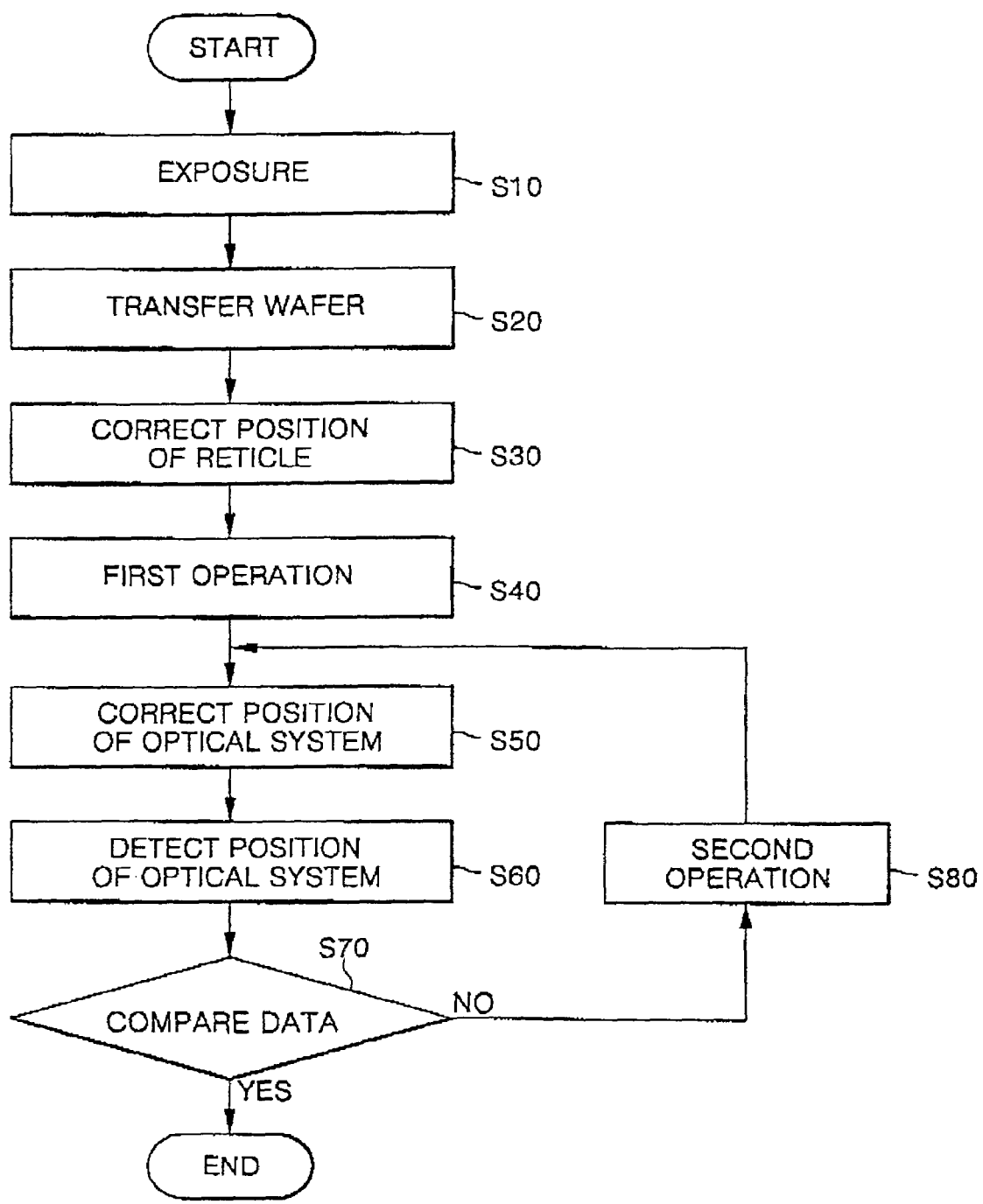
FIG. 3 is a block diagram depicting an exposure process according to the present invention.

An exemplary exposure process adapted for use within the context of the foregoing exposure equipment 100 will now be described. As previously noted, this exposure process is but one part of a photolithography process adapted for use in the manufacture of a semiconductor device. During this discussion reference is made to FIGS. 1 through 3.

Initially, wafer 90 is provided to wafer stage 171 and reticle 131 is provided to reticle stage 133, and illuminating system 110 irradiates a target portion of wafer 90 with light of a desired wavelength once optical system 150 is properly positioned under reticle 131 (S10).

After this first shot, (e.g., the light is properly irradiated onto the first target), wafer transferring unit 175 quickly transfers wafer 90 in the X and/or Y directions in order to set up a second shot associated with a next adjacent target (S20). (In a succession of shots to associated targets, light is ultimately irradiated over the entire surface of wafer 90 by illuminating system 110).

If during the transfer of wafer 90 between shots reticle 131 is minutely shifted from its set point due to vibrations induced by the movement of wafer transferring unit 175, controller 157 detects this shift, and defines a certain compensation value to be output to reticle-position correcting unit 137. Reticle-position correcting unit 137 minutely re-adjusts reticle stage 133 holding reticle 131 in a desired direction to at least partially compensate for the vibration induced positioning error (S30).

Next, data comparator 158, provided within controller 157 compares the movement data from wafer transferring unit 175 and the compensation data from reticle-position correcting unit 137 with the reference data in order to define a position compensation value to be applied to optical system 150, if needed (S40).

Then, if the position compensation value should be applied to adjust the position of optical system 150, data comparator 158 transmits the position compensation value to unit controller 159 and unit controller 159 controls the operation of correction unit 155 according to the position compensation value. As such, correction unit 155 corrects the position of optical system 150 under the control of unit controller 159 (S50).

Once the position of optical system 150 has been compensated, the plurality of position sensors 154 detects the movement of optical system 150 in order to measure the position of optical system 150 as compensated by correction unit 155 (S60), and transmits the measured data to the data comparator 158. Data comparator 158 compares the compensation data provided by correction unit 155 with the reference data to determine whether the compensation data is identical to the reference data (S70).

If the compensation data is identical to the reference data, the compensation of optical system 150 has been properly achieved, and exposure equipment 100 completes the compensation routine.

If, however, the compensation data is not identical to the reference data, data comparator 158 compares the compensation data provided by correction unit 155 with the reference data to again (for a second time) define a position compensation value to be applied to optical system 150 (S80). Here again, unit controller 159 controls correction unit 155 according to the newly defined compensation value, and correction unit 155 again adjusts the position of optical system 150 under the control of unit controller 159 (S50). Thereafter, the position of optical system 150 may be precisely corrected through the repeated process, thereby completely eliminating any positioning error resulting from mechanical vibrations caused by movement of wafer transferring unit 175.

As may be understood from the foregoing examples, exposure equipment adapted for use in the manufacture of semiconductor devices may be accurately positioned without errors resulting from vibration induced positioning errors caused by movement of a wafer transferring unit. In other words, dynamic performance error produced by the mechanical vibration of an optical system within the exposure equipment may be eliminated or minimized. In this manner, the present invention may remedy the transfer image defect produced by a conventional dynamic performance error.

What is claimed is:

1. Exposure equipment adapted for use in the manufacture of a semiconductor device, comprising:
    a wafer seat adapted to seat a wafer;
    an illuminating system adapted to irradiating the wafer with light of a desired wavelength;
    a reticle support interposed between the wafer seat and the illuminating system and adapted to hold a reticle such that the light from the illuminating system passes through the reticle to the wafer;
    an optical system interposed between the wafer seat and the reticle support and adapted to transmit the patterned light from the reticle to a target portion of the wafer; and
    optical-system positioning mechanism adapted to measure and compensate for movement of the optical system,
    wherein:
        the optical-system positioning mechanism comprises:
            a correction unit adapted to position the optical system;
            a data comparator adapted to compare movement data from a wafer transferring unit and compensation data from a reticle-position correcting unit with a reference data in order to define a compensation value to be applied to the optical system; and,
            a unit controller adapted to control the correction unit to allow the correction unit to adjust the position of the optical system in accordance with the compensation value from the data comparator; and,
        the correction unit comprises at least two electric motors mounted to an outer periphery of the optical system to correct the position of the optical system in the X-axis direction and the Y-axis direction, respectively.

2. The exposure equipment of claim 1, wherein the wafer seat comprises the wafer transferring unit which is adapted to transfer the wafer such that the light may irradiate substantially the entire surface of the wafer.

3. The exposure equipment of claim 2, wherein the reticle support comprises the reticle-position correcting unit, which is adapted to compensate for a vibration induced positioning error produced by movement of the wafer seat.

4. The exposure equipment of claim 1, wherein the optical-system positioning mechanism comprises a plurality of position sensors adapted to detect movement of the optical system, and the correction unit is adapted to adjust the position of the optical system in accordance with data provided by the plurality of position sensors.

5. The exposure equipment of claim 4, wherein the plurality of position sensors comprises at least two geophone sensors mounted to an outer periphery of the optical system to detect movement in the X-axis direction and movement of the optical system in the Y-axis direction, respectively.

6. The exposure equipment of claim 1, wherein the optical-system positioning mechanism comprises a plurality of position sensors adapted to detect movement of the optical system as compensated by the correction unit.

7. The exposure equipment of claim 6, wherein the plurality of position sensors comprises at least two geophone sensors mounted on an outer periphery of the optical system and adapted to detect movement of the optical system in the X-axis direction and Y-axis direction, respectively.

8. A method of operating exposure equipment useful in the manufacture of semiconductor devices, comprising:
    directing light through a reticle and an optical system positioned above a wafer onto a target portion of the wafer;
    transferring the wafer;
    correcting the position of the reticle in response to movement data associated with transfer of the wafer;
    comparing movement data associated with transfer of the wafer and compensation data associated with the position of the reticle with a reference data in order to define a position compensation value for the optical system; and,
    recursively compensating for undesired movement of the optical system caused by the rapid transfer of the wafer,
    wherein the recursive compensation comprises:
        correcting the position of the optical system in the X-axis direction and/or the Y-axis direction in relation to the position compensation value;
        detecting the corrected position of the optical system to define a positional value; and,
        comparing the positional data to the reference data.

9. The method of claim 8, wherein the recursive compensation further comprises:
    upon determining that the positional data is identical to the reference data, ending the method, or
    upon determining that the positional data is not identical to the reference data correcting the position of the optical system again in relation to a new position compensation value.

10. The method of claim 9, wherein the new position compensation value is calculated before correcting the position of the optical system again.

11. The method of claim 10, wherein calculating the new compensation value comprises comparing the positional data with the reference data.

* * * * *